(12) United States Patent
Kim et al.

(10) Patent No.: US 12,648,328 B2
(45) Date of Patent: Jun. 2, 2026

(54) DISPLAY DEVICE AND METHOD OF MANUFACTURING THE SAME

(71) Applicant: Samsung Display Co., LTD., Yongin-si (KR)

(72) Inventors: Young Min Kim, Yongin-si (KR); Hyun Seok Kim, Yongin-si (KR); Hae Il Park, Yongin-si (KR); Moon Jung Baek, Yongin-si (KR); Seon Tae Yoon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 531 days.

(21) Appl. No.: 18/086,861

(22) Filed: Dec. 22, 2022

(65) Prior Publication Data

US 2023/0371339 A1     Nov. 16, 2023

(30) Foreign Application Priority Data

May 12, 2022     (KR) ........................ 10-2022-0058541

(51) Int. Cl.
| *H10K 59/38* | (2023.01) |
| *H10K 50/30* | (2023.01) |
| *H10K 59/131* | (2023.01) |
| *H10K 59/80* | (2023.01) |
| *H10K 59/12* | (2023.01) |

(52) U.S. Cl.
CPC ............. *H10K 59/38* (2023.02); *H10K 50/30* (2023.02); *H10K 59/131* (2023.02); *H10K 59/878* (2023.02); *H10K 59/1201* (2023.02)

(58) Field of Classification Search
CPC ...... H10K 59/38; H10K 50/30; H10K 50/856; H10K 59/131; H10K 59/1201; H10K 59/123; H10K 59/80518; H10K 59/878; H10K 59/12; H10K 50/805; H10K 59/122; H10K 59/124; H10K 71/00
See application file for complete search history.

(56) References Cited

U.S. PATENT DOCUMENTS

| 11,228,012 | B2 | 1/2022 | Lee et al. | |
| 2017/0125492 | A1* | 5/2017 | Kim ....................... | H10K 10/82 |
| 2018/0190737 | A1* | 7/2018 | Yang .................... | H10K 59/131 |

(Continued)

FOREIGN PATENT DOCUMENTS

| KR | 1020150065526 A | 6/2015 |
| KR | 1020200036235 A | 4/2020 |

(Continued)

*Primary Examiner* — Jacob Y Choi
*Assistant Examiner* — Ashley Nicole Blackwell
(74) *Attorney, Agent, or Firm* — CANTOR COLBURN LLP

(57) ABSTRACT

A display device includes a transistor on a base layer, the transistor including an active layer, a gate electrode, a first transistor electrode electrically connected to a first contact region of the active layer, and a second transistor electrode electrically connected to a second contact region of the active layer; an interlayer insulating layer on the gate electrode; a bank on the interlayer insulating layer and protruding in a thickness direction of the base layer; a color conversion layer between banks and including quantum dots that change a color of light; and a light emitting element on the color conversion layer, and a reflective electrode layer is on the bank.

21 Claims, 12 Drawing Sheets

CF: CF1, CF2, CF3
TR: TE1, TE2, GE, ACT
REL: REL1, REL2
PAD: PAL1, PAL2
CNT: BCNT, CNT1, CNT2

(56)     References Cited

U.S. PATENT DOCUMENTS

| 2019/0131580 A1* | 5/2019 | Youn | H10K 50/11 |
| 2019/0165062 A1* | 5/2019 | Heo | H10K 59/123 |
| 2020/0373359 A1 | 11/2020 | Lee et al. | |
| 2021/0028272 A1* | 1/2021 | Won | H10K 59/1315 |
| 2021/0313400 A1 | 10/2021 | Bae et al. | |
| 2022/0067326 A1* | 3/2022 | Wang | H10K 39/00 |

FOREIGN PATENT DOCUMENTS

| KR | 10-2020-0135130 | 12/2020 |
| KR | 10-2021-0124583 | 10/2021 |

* cited by examiner

CF: CF1, CF2, CF3
TR: TE1, TE2, GE, ACT
REL: REL1, REL2
PAD: PAL1, PAL2
CNT: BCNT, CNT1, CNT2

| |
|---|
| HIL |
| HTL |
| LGL |
| HBL |
| ETL |
| EIL |

FIG. 5

CF: CF1, CF2, CF3
TR: TE1, TE2, GE, ACT
REL: REL1, REL2
PAD: PAL1, PAL2
CNT: BCNT, CNT1, CNT2

CF: CF1, CF2, CF3

CF: CF1, CF2, CF3
CH: BCH, CH1, CH2

FIG. 8

CF: CF1, CF2, CF3
TR: TE1, TE2, GE, ACT
CNT: BCNT, CNT1, CNT2

FIG. 9

CF: CF1, CF2, CF3
TR: TE1, TE2, GE, ACT
REL: REL1, REL2
PAD: PAL1, PAL2
CNT: BCNT, CNT1, CNT2

FIG. 10

CF: CF1, CF2, CF3
TR: TE1, TE2, GE, ACT
REL: REL1, REL2
PAD: PAL1, PAL2
CNT: BCNT, CNT1, CNT2

FIG. 11

CF: CF1, CF2, CF3
TR: TE1, TE2, GE, ACT
REL: REL1, REL2
PAD: PAL1, PAL2
CNT: BCNT, CNT1, CNT2

Figure 12:
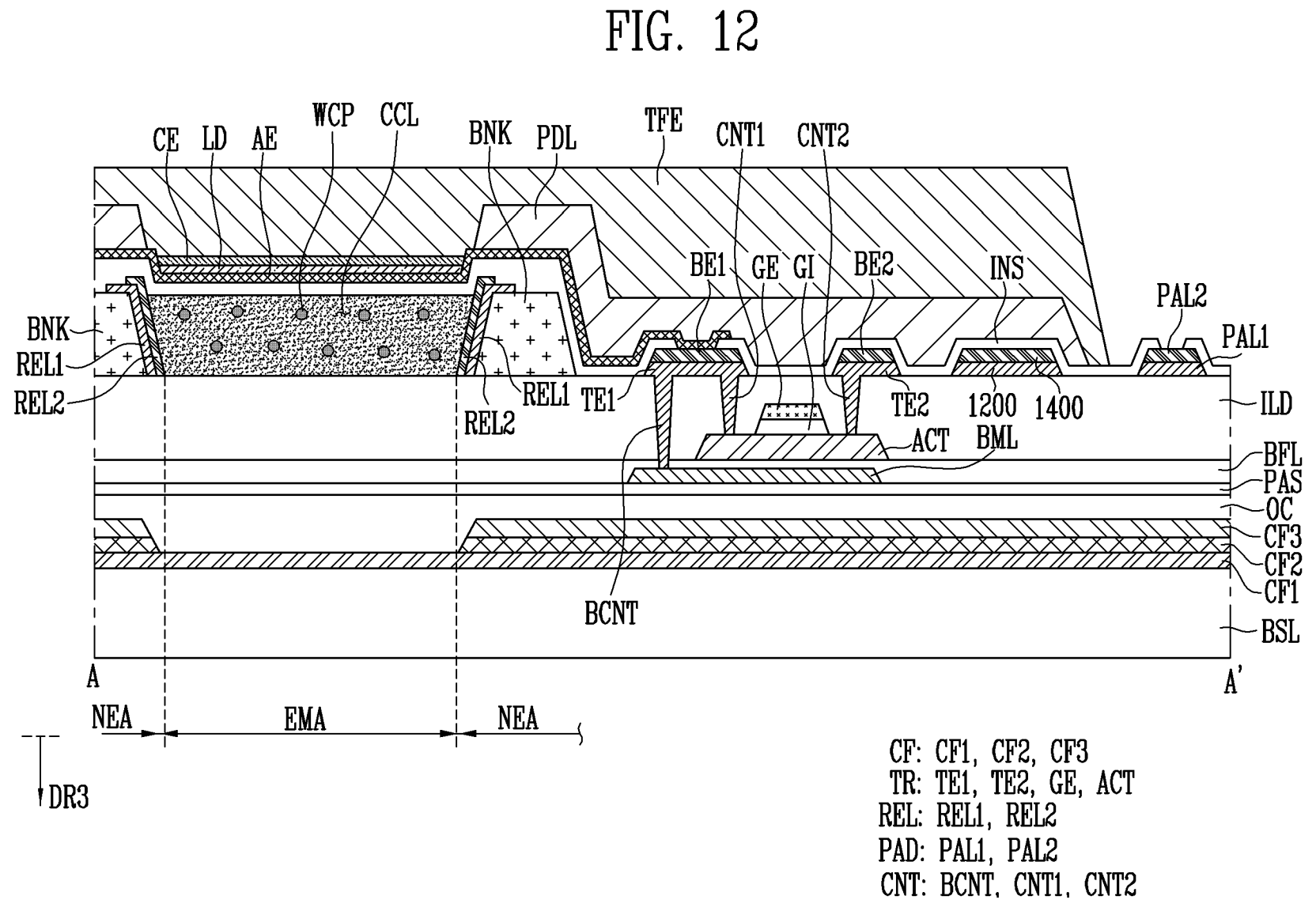

WCP CCL

BNK PDL

TFE CNT1 CNT2

INS

PAL2

PAL1

ILD

BFL
PAS
OC
CF3
CF2
CF1
BSL

REL1 TE1

REL2

BE1 GE GI BE2

TE2

1200 1400

ACT BML

BCNT

BNK
REL1
REL2

NEA      EMA      NEA

A      A'

DR3

CF: CF1, CF2, CF3
TR: TE1, TE2, GE, ACT
REL: REL1, REL2
PAD: PAL1, PAL2
CNT: BCNT, CNT1, CNT2

DISPLAY DEVICE AND METHOD OF MANUFACTURING THE SAME

CROSS-REFERENCE TO RELATED APPLICATION(S)

This application claims priority to and benefits of Korean Patent Application No. 10-2022-0058541 under 35 U.S.C. § 119, filed May 12, 2022 in the Korean Intellectual Property Office, the entire contents of which are incorporated herein by reference.

BACKGROUND

1. Technical Field

The disclosure relates to a display device and a method of manufacturing the same.

2. Description of the Related Art

In recent years, as interest in information displays is increasing, research and development on display devices are continuously conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An object of the disclosure provides a display device and a method of manufacturing the same in which process costs can be reduced by simplifying process steps.

According to one or more embodiments, a display device may include; a transistor disposed on a base layer, the transistor comprising an active layer; a gate electrode; a first transistor electrode electrically connected to a first contact region of the active layer; and a second transistor electrode electrically connected to a second contact region of the active layer; an interlayer insulating layer disposed on the gate electrode; a bank disposed on the interlayer insulating layer and protruding in a thickness direction of the base layer; a color conversion layer disposed between banks and including quantum dots that change a color of light; and a light emitting element disposed on the color conversion layer. A reflective electrode layer may be disposed on the bank.

According to one or more embodiments, at least a portion of the reflective electrode layer, the first transistor electrode, and the second transistor electrode may be on a same layer and the least the portion of the reflective electrode layer, the first transistor electrode, and the second transistor electrode may include a same material.

According to one or more embodiments, the reflective electrode layer may include a first reflective electrode disposed on the bank; and a second reflective electrode disposed on the first reflective electrode, and the first reflective electrode, the first transistor electrode, and the second transistor electrode may be disposed on a same layer.

According to one or more embodiments, the display device may further include a first bridge electrode disposed on the first transistor electrode; a second bridge electrode disposed on the second transistor electrode; and pads disposed on the interlayer insulating layer and including a first pad layer and a second pad layer disposed on the first pad layer. The first reflective electrode and the first pad layer may be disposed on a same layer, and the second reflective electrode, the first bridge electrode, the second bridge electrode, and the second pad layer, may be disposed on a same layer.

According to one or more embodiments, the bank may separate the light emitting element and the active layer.

According to one or more embodiments, the display device may further include an insulating layer, at least a portion of which is disposed on the color conversion layer. The insulating layer may cover the color conversion layer, the first transistor electrode, and the second transistor electrode.

According to one or more embodiments, the interlayer insulating layer may form a surface on which the bank, the first transistor electrode, and the second transistor electrode are disposed, and the interlayer insulating layer may be disposed below the first and second transistor electrodes and disposed on the base layer.

According to one or more embodiments, the first transistor electrode may be electrically connected to the first contact region through a first contact portion, the second transistor electrode may be electrically connected to the second contact region through a second contact portion, each of the first contact portion and the second contact portion may penetrate at least a portion of the interlayer insulating layer, and at least a portion of the reflective electrode, the first contact portion, and the second contact portion layer may include a same material.

According to one or more embodiments, the bank may protrude in a direction to define a space including the color conversion layer, the bank may be spaced apart from the base layer by a first distance, the first transistor electrode and the second transistor electrode may be spaced apart from the base layer by a second distance, and the first distance and the second distance may be substantially equal to each other.

According to one or more embodiments, the color conversion layer may be disposed between the light emitting element and the base layer, and light provided by the light emitting element may be provided to outside of the display device through the color conversion layer and the base layer.

According to one or more embodiments, the display device may further include a color filter layer disposed on the base layer. The color filter layer may be disposed between the active layer and the base layer.

According to one or more embodiments, the display device may further include a color filter layer disposed on the base layer. The active layer may be disposed between the color filter layer and the base layer.

According to an embodiment, a method of manufacturing a display device may include disposing an active layer, a gate insulating layer, a gate electrode, and an interlayer insulating layer on a base layer; disposing a bank on the interlayer insulating layer; disposing a reflective electrode layer on the bank; forming a first transistor electrode and a second transistor electrode on the interlayer insulating layer, the first transistor electrode being electrically connected to a first contact region of the active layer, and the second transistor electrode being electrically connected to a second contact region of the active layer; disposing a color conversion layer including quantum dots that change a color of light between banks; and disposing a light emitting element on the color conversion layer.

According to one or more embodiments, the reflective electrode layer may include a first reflective electrode disposed on the bank, and the first reflective electrode, the first transistor electrode, and the second transistor electrode may be formed in a same process.

According to one or more embodiments, the method may further include disposing a first bridge electrode on the first transistor electrode; and disposing a second bridge electrode on the second transistor electrode. The reflective electrode layer may include a second reflective electrode disposed on the first reflective electrode, and the second reflective electrode, the first bridge electrode, and the second bridge electrode may be formed in a same process.

According to one or more embodiments, the method may further include forming an insulating layer to cover the color conversion layer, the first transistor electrode, and the second transistor electrode.

According to one or more embodiments, the disposing of the light emitting element may include performing a deposition process to form layers for forming the light emitting element. The performing of the deposition process may be performed after the disposing of the color conversion layer.

According to one or more embodiments, the light emitting element may be an organic light emitting diode.

According to one or more embodiments, the method may further include disposing a color filter layer on the base layer. The color filter layer and the color conversion layer may be disposed between the base layer and the light emitting element.

According to one or more embodiments, the method may further include forming a first contact hole and a second contact hole in the interlayer insulating layer; and forming a first contact portion corresponding to the first contact hole and a second contact portion corresponding to the second contact hole. The first transistor electrode may be electrically connected to the first contact region through the first contact portion, the second transistor electrode may be electrically connected to the second contact region through the second contact portion, and the first contact portion, the second contact portion, and the first reflective electrode may be formed in a same process.

BRIEF DESCRIPTION OF THE DRAWINGS

The accompanying drawings, which are included to provide a further understanding of the disclosure, and are incorporated in and constitute a part of this specification, illustrate embodiments of the disclosure, and, together with the description, serve to explain principles of the disclosure.

FIGS. 3 and 5 are schematic cross-sectional views schematically illustrating the display device according to embodiments.

FIG. 4 is a schematic cross-sectional view for explaining a structure of a light emitting element according to one or more embodiments.

FIGS. 6 to 12 are schematic cross-sectional views schematically illustrating a method of manufacturing a display device according to embodiments in each process step.

DETAILED DESCRIPTION OF THE EMBODIMENTS

Figure 1:
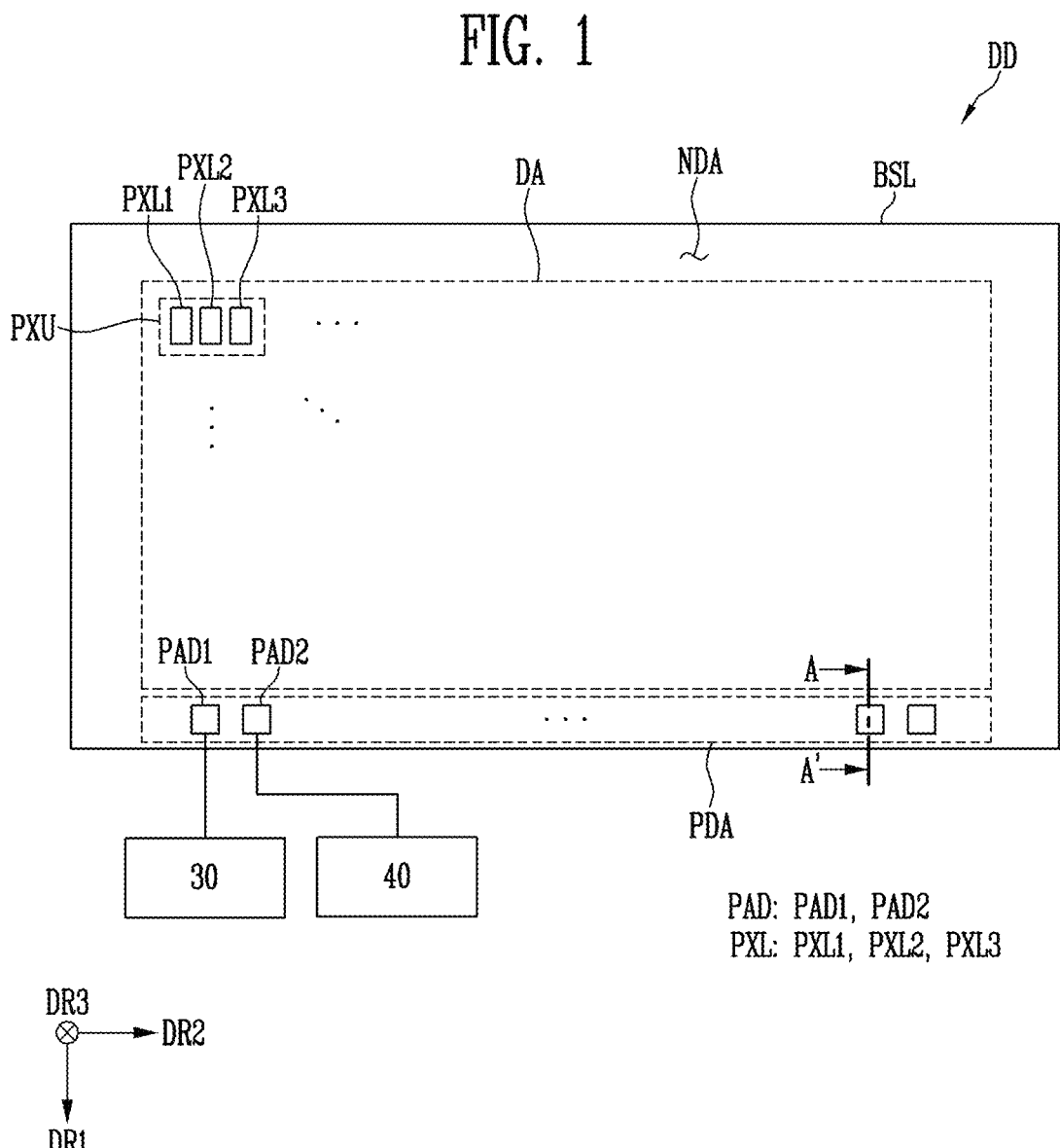
FIG. 1 is a schematic plan view schematically illustrating a display device according to one or more embodiments.

As the disclosure allows for various changes and numerous embodiments, embodiments will be illustrated in the drawings and described in detail in the written description. However, this is not intended to limit the disclosure to particular modes of practice, and it is to be appreciated that all changes, equivalents, and substitutes that do not depart from the features and technical scope of the disclosure are encompassed in the disclosure.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms "first", "second", etc. may be used herein to describe various elements, these elements should not be limited by these terms. These terms are only used to distinguish one element from another element. For instance, a first element discussed below could be termed a second element without departing from the scope of the disclosure. Similarly, the second element could also be termed the first element. In the disclosure, the singular expressions are intended to include the plural expressions as well, unless the context clearly indicates otherwise.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

It will be further understood that the terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

In addition, when a first part such as a layer, film, region, part, etc. is "on" a second part, the first part may be not only "directly on" the second part but a third part or other parts may intervene between them. Furthermore, in the disclosure, when a first part such as a layer, film, region, part, etc. is formed on a second part, a direction in which the first part is formed is not limited to an upper direction of the second part, but may include a side or a lower direction of the second part. To the contrary, when a first part such as a layer, film, region, part, etc. is "under" (or "below") a second part, the first part may be not only "directly under" the second part but a third part or other parts may intervene between them.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The disclosure relates to a display device. Hereinafter, a display device and a method of manufacturing the same according to embodiments will be described with reference to the accompanying drawings.

FIG. 1 is a schematic plan view schematically illustrating a display device according to one or more embodiments.

Referring to FIG. 1, a display device DD according to one or more embodiments may include a base layer BSL and a pixel PXL. The display device DD may further include a scan driver 30 and a data driver 40. The display device DD may further include pads PAD.

The base layer BSL may form a base surface for forming components of the display device DD. The components of the display device DD (for example, a color filter layer CF of FIG. 3, a color conversion layer CCL, and a light emitting element LD of FIG. 3) may be sequentially formed on the base layer BSL.

The base layer BSL may include a rigid or flexible substrate or film. For example, the base layer BSL may be a rigid substrate made of glass or tempered glass, a flexible substrate (or thin film) made of plastic or metal, or at least one insulating layer. However, the disclosure is not necessarily limited to the above-described examples.

According to one or more embodiments, the base layer BSL may transmit light. The base layer BSL may be substantially transparent. Here, the term "substantially transparent" may mean that light can be transmitted with a given transmittance or more. For example, according to one or more embodiments, light provided by the light emitting element LD of the display device DD may pass through the base layer BSL and may be emitted to outside of the display device DD. Details on this will be described later with reference to FIG. 2.

The display device DD (or the base layer BSL) may include a display area DA and a non-display area NDA outside the display area DA.

The pixel PXL may be disposed in the display area DA. The display area DA may form a screen on which an image is displayed. The pixel PXL may include the light emitting element LD. The pixel PXL may emit light based on a signal provided from the scan driver 30 and/or a signal provided from the data driver 40. According to one or more embodiments, the pixel PXL may include a pixel unit PXU. The pixel PXL may include a first sub-pixel PXL1, a second sub-pixel PXL2, and a third sub-pixel PXL3.

The pixel unit PXU may be disposed in the display area DA. The pixel unit PXU may include the first sub-pixel PXL1, the second sub-pixel PXL2, and/or the third sub-pixel PXL3. Hereinafter, when at least one pixel among the first sub-pixel PXL1, the second sub-pixel PXL2, and the third sub-pixel PXL3 is arbitrarily referred to or two or more kinds of pixels are generally referred to, they will be referred to as "pixel PXL" or "pixels PXL".

Pixels PXL may be regularly arranged (or disposed) according to a stripe or PENTILE™ arrangement structure. However, the arrangement structure of the pixels PXL is not limited thereto, and the pixels PXL may be arranged in the display area DA in various structures and/or methods.

According to one or more embodiments, first sub-pixels PXL1 emitting light of a first color, second sub-pixels PXL2 emitting light of a second color, and third sub-pixels PXL3 emitting light of a third color may be arranged in the display area DA. The first to third sub-pixels PXL1, PXL2, and PXL3 disposed adjacent to each other may constitute one pixel unit PXU capable of emitting light of various colors. For example, each of the first to third sub-pixels PXL1, PXL2, and PXL3 may be a pixel emitting light of a given color. According to one or more embodiments, the first sub-pixel PXL1 may be a red pixel emitting red light, the second sub-pixel PXL2 may be a green pixel emitting green light, and the third sub-pixel PXL3 may be a blue pixel emitting blue light. However, the disclosure is not limited thereto.

In one or more embodiments, the first sub-pixel PXL1, the second sub-pixel PXL2, and the third sub-pixel PXL3 may include light emitting elements emitting light of a same color, but may have a color conversion layer CCL (refer to FIG. 3) and/or a color filter layer CF (refer to FIG. 3) disposed on each of the light emitting elements and having different colors to emit light of the first color, the second color, and the third color, respectively. In an embodiment, the first sub-pixel PXL1, the second sub-pixel PXL2, and the third sub-pixel PXL3 may have a light emitting element of the first color, a light emitting element of the second color, and a light emitting element of the third color as light sources to emit light of the first color, the second color, and the third color, respectively. However, the color, type, and/or number of the pixels PXL constituting the pixel unit PXU is not particularly limited. For example, the color of the light emitted by each pixel PXL may be variously changed.

The scan driver 30 may output a scan signal. The data driver 40 may output a data signal. The scan driver 30 and the data driver 40 may be connected to wirings of the display device DD.

Various wirings, pads PAD, and/or built-in circuit units connected to the pixels PXL of the display area NDA may be disposed in the non-display area NDA.

A pad area PDA may be disposed in the non-display area NDA. The non-display area NDA may include the pad area PDA. The pad area PDA may be disposed on one side or a side of the display area DA. Although the pad area PDA is disposed adjacent to a lower side of the display area DA in FIG. 1, the disclosure is not limited thereto.

The pads PAD may be disposed within the pad area PDA. Pads PAD may be provided. According to one or more embodiments, the pads PAD may include a first pad PAD1 and a second pad PAD2. The first pad PAD1 may be a gate pad and the second pad PAD2 may be a data pad. The first pad PAD1 may be connected to the scan driver 30. The scan signal provided from the scan driver 30 may be transferred to a scan line for the pixel PXL via the first pad PAD1. The second pad PAD2 may be connected to the data driver 40. The data signal provided from the data driver 40 may be transferred to a data line for the pixel PXL via the second pad PAD2.

Figure 2:
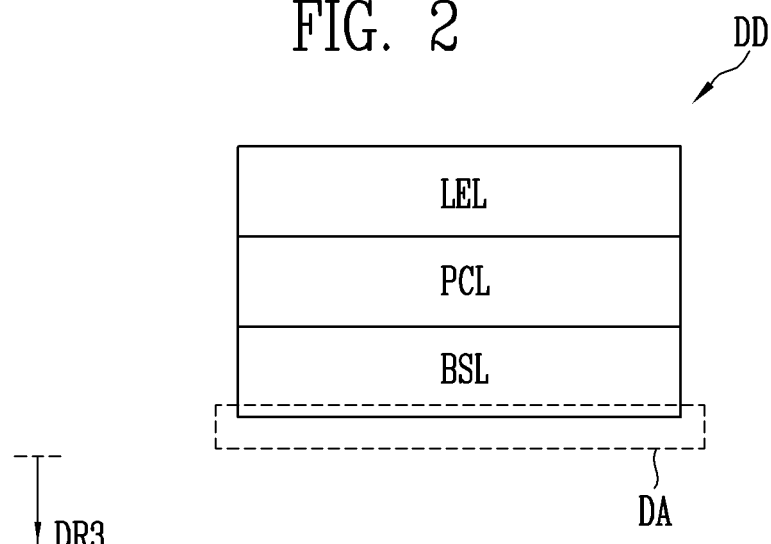
FIG. 2 is a schematic cross-sectional view schematically illustrating the display device according to one or more embodiments.

FIG. 2 is a schematic cross-sectional view schematically illustrating the display device according to one or more embodiments.

Referring to FIG. 2, the display device DD according to one or more embodiments may include the base layer BSL, a pixel circuit layer PCL, and a display element layer LEL.

The base layer BSL may form a region (or surface) on which the pixel circuit layer PCL and the display element layer LEL may be disposed.

The pixel circuit layer PCL may be disposed on the base layer BSL. At least a portion of the pixel circuit layer PCL may be interposed between the display element layer LEL and the base layer BSL. The pixel circuit layer PCL may include a pixel circuit for driving the pixel PXL. The pixel circuit may include at least one transistor TR (refer to FIG. 3) and a storage capacitor. According to one or more embodiments, the pixel circuit layer PCL may be referred to as a backplane layer.

The display element layer LEL may be disposed on the pixel circuit layer PCL. At least a portion of the display element layer LEL may be further spaced apart from the base layer BSL than the pixel circuit layer PCL. The display element layer LEL may be a layer including the light emitting element LD that emits light.

The display device DD may be a bottom emission display. For example, light provided from the display element layer LEL may pass through the base layer BSL and may be emitted to the outside of the display device DD. The light provided from the display element layer LEL may be directed in a thickness direction (for example, a third direction DR3) of the base layer BSL. According to one or more embodiments, the light provided from the display element layer LEL may pass through the pixel circuit layer PCL and the base layer BSL. Accordingly, the display area DA of the display device DD may be defined on one surface or a surface of the base layer BSL on which the pixel circuit layer PCL is not disposed.

Hereinafter, a cross-sectional structure of the display device DD according to one or more embodiments will be described in more detail with reference to FIGS. 3 to 5. Contents that may overlap the above-described contents will be briefly described or will not be repeatedly described.

Figure 3:
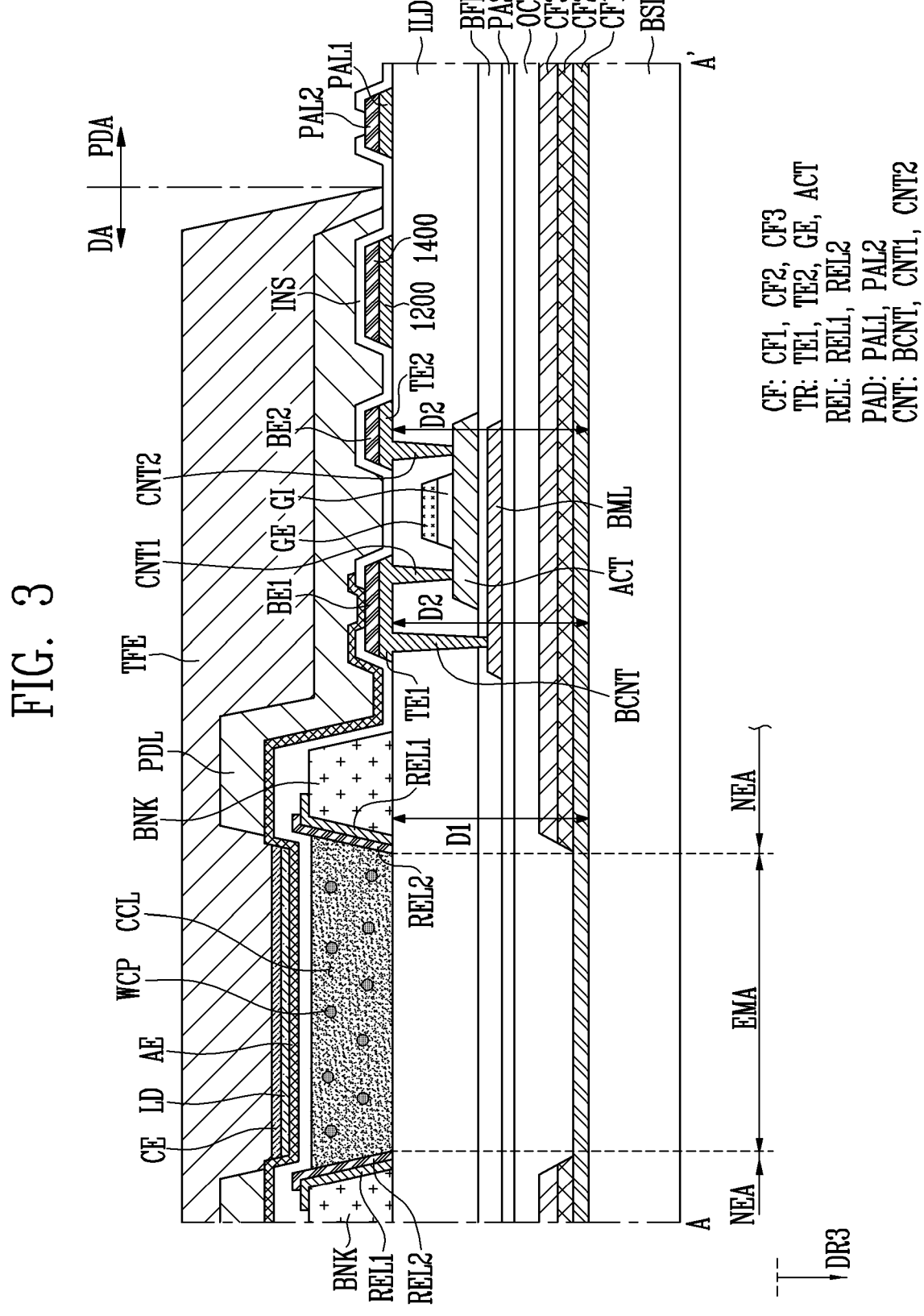
Figure 4:
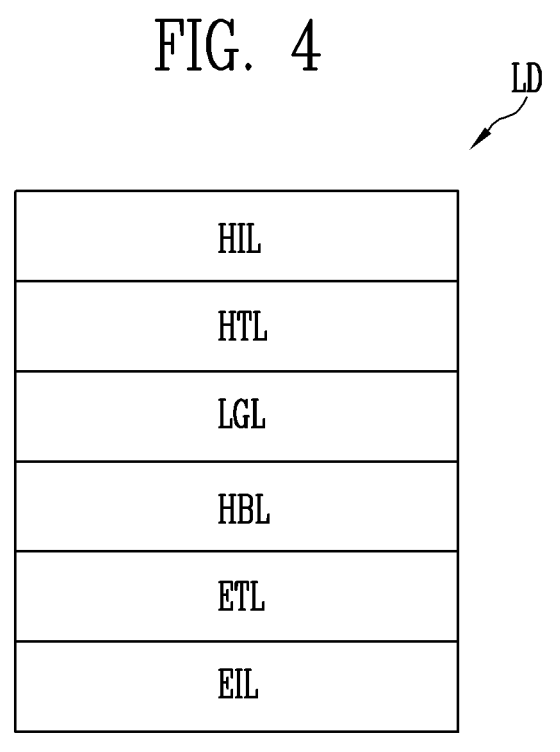
Figure 5:
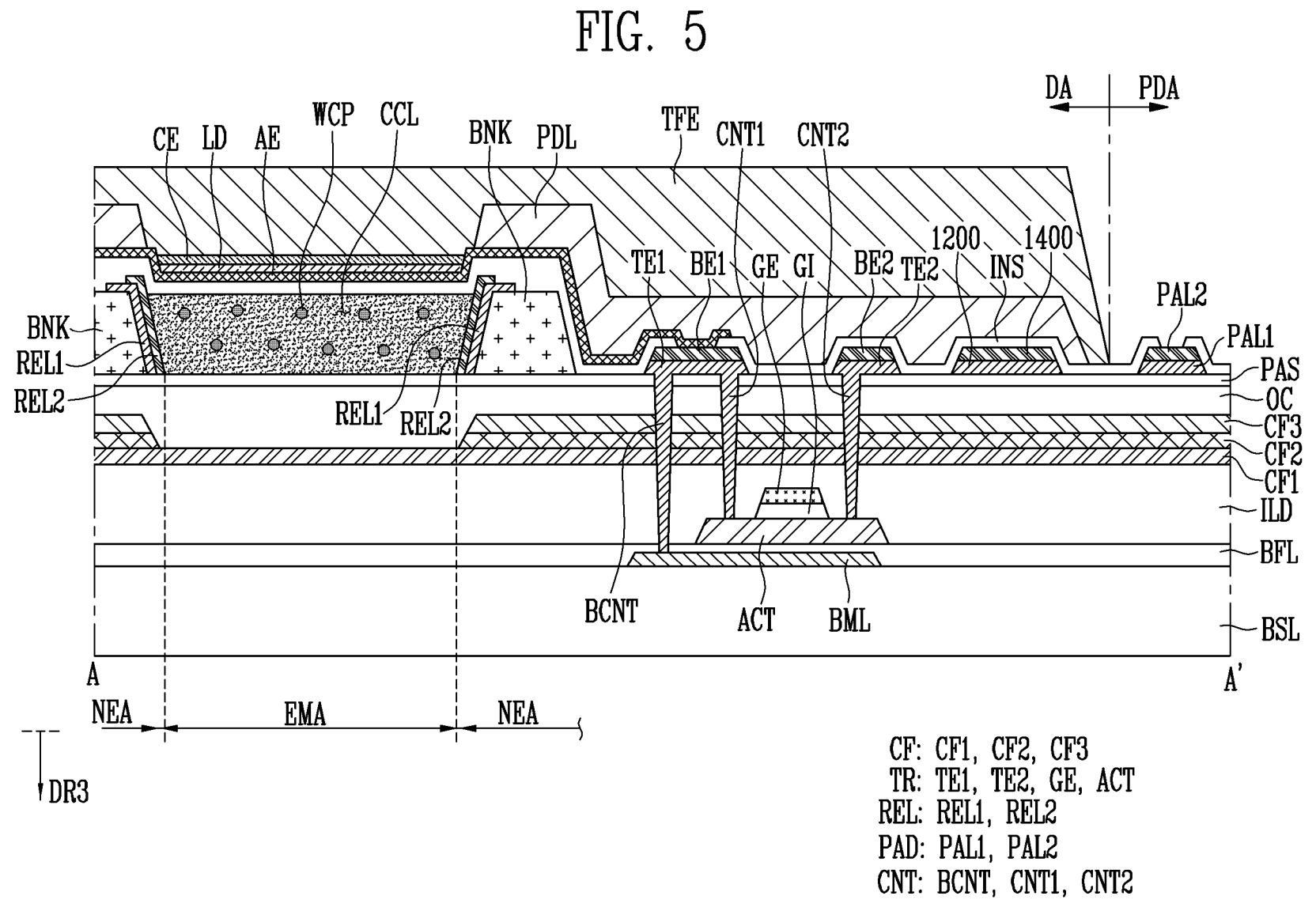

FIGS. 3 and 5 are schematic cross-sectional views schematically illustrating the display device according to embodiments. FIGS. 3 and 5 may be schematic cross-sectional views taken along line A-A' of FIG. 1. FIG. 3 may be a diagram illustrating the display device DD according to one or more embodiments. FIG. 5 may be a diagram illustrating the display device DD according to an embodiment. FIG. 4 is a schematic cross-sectional view for explaining a structure of a light emitting element according to one or more embodiments. FIG. 4 may illustrate layers forming the light emitting element LD according to one or more embodiments.

First, the display device DD according to one or more embodiments will be described with reference to FIGS. 3 and 4. Referring to FIG. 3, the display device DD may include the base layer BSL, the color filter layer CF, a planarization layer OC, a passivation layer PAS, a buffer layer BFL, a lower auxiliary electrode BML, a transistor TR, a gate insulating layer GI, an interlayer insulating layer ILD, first and second bridge electrodes BE1 and BE2, first and second additional electrodes 1200 and 1400, a bank BNK, a reflective electrode layer REL, the pads PAD, an insulating layer INS, an anode electrode AE, the light emitting element LD, a cathode electrode CE, a pixel defining layer PDL, and a thin film encapsulation layer TFE.

The base layer BSL may be a base surface of the display device DD. The base layer BSL may transmit light, and thus, light provided from the light emitting element LD may pass through the base layer BSL.

The color filter layer CF may be disposed on the base layer BSL. The color filter layer CF may be provided over sub-pixels (for example, the first to third sub-pixels PXL1, PXL2, and PXL3). The color filter layer CF may be disposed between the layer including the transistor TR and the base layer BSL.

The color filter layer CF may include a first color filter CF1, a second color filter CF2, and a third color filter CF3.

The first color filter CF1 may transmit light of the first color, but may not transmit light of the second and third colors. For example, the first color filter CF1 may include a colorant related to the first color.

The second color filter CF2 may transmit light of the second color, but may not transmit light of the first and third colors. For example, the second color filter CF2 may include a colorant related to the second color.

The third color filter CF3 may transmit light of the third color, but may not transmit light of the first and second colors. For example, the third color filter CF3 may include a colorant related to the third color.

According to one or more embodiments, depending on the types of the sub-pixels constituting the pixel PXL, the types of the color filters CF1, CF2, and CF3 overlapping the emission area EMA from which light is emitted may be different.

For example, in the first sub-pixel PXL1, the emission area EMA from which light is emitted from the light emitting element LD may overlap the first color filter CF1 in a plan view and may not overlap the second color filter CF2 and the third color filter CF3. For convenience of description, FIG. 3 shows a structure including the first sub-pixel PXL1.

According to another example, in the second sub-pixel PXL2, the emission area EMA from which light is emitted from the light emitting element LD may overlap the second color filter CF2 in a plan view and may not overlap the first color filter CF1 and the third color filter CF3.

According to another example, in the third sub-pixel PXL3, the emission area EMA from which light is emitted from the light emitting element LD may overlap the third color filter CF3 in a plan view and may not overlap the first color filter CF1 and the second color filter CF2.

According to one or more embodiments, light may be blocked at positions where the first to third color filters CF1, CF2, and CF3 overlap each other. Accordingly, positions of the sub-pixels (for example, the first to third sub-pixels PXL1, PXL2, and PXL3) may be clearly defined individually. However, the disclosure is not limited to the above-described examples. For example, the positions of the sub-pixels may not be defined as the first to third color filters CF1, CF2, and CF3 overlap each other, but the positions of the sub-pixels may be defined as a light blocking member is disposed at a given position. For example, the light blocking member may include a black matrix.

The planarization layer OC may be disposed on the color filter layer CF. The planarization layer OC may be provided over the sub-pixels (for example, the first to third sub-pixels PXL1, PXL2, and PXL3). The planarization layer OC may cover the color filter layer CF. The planarization layer OC may reduce a step difference caused by the color filter layer CF.

According to one or more embodiments, the planarization layer OC may include an organic material such as an acrylates resin, an epoxy resin, a phenolic resin, a poly-amides resin, a polyimides resin, a polyesters resin, a polyphenylenesulfides resin, or benzocyclobutene (BCB). However, the disclosure is not necessarily limited to the above-described examples.

The passivation layer PAS may be disposed on the planarization layer OC. The passivation layer PAS may be disposed between the buffer layer BFL and the planarization layer OC. The passivation layer PAS may be provided over the sub-pixels (for example, the first to third sub-pixels PXL1, PXL2, and PXL3). According to one or more embodiments, the passivation layer PAS may include at least one selected from the group consisting of silicon nitride (SiN$_x$), silicon oxide (SiO$_x$), silicon oxynitride (SiO$_x$N$_y$), and aluminum oxide (AlO$_x$). However, the disclosure is not limited to the above-described examples.

The lower auxiliary electrode BML may be disposed on the passivation layer PAS. The lower auxiliary electrode BML may be a path through which an electrical signal is transmitted. According to one or more embodiments, a portion of the lower auxiliary electrode BML may overlap the transistor TR in a plan view. The lower auxiliary electrode BML may be electrically connected to a first transistor electrode TE1 through a lower contact portion BCNT.

The buffer layer BFL may be disposed on the passivation layer PAS. The buffer layer BFL may cover the lower auxiliary electrode BML. The buffer layer BFL may prevent impurities from diffusing from outside. The buffer layer BFL may include one of silicon oxide (SiO$_x$), silicon nitride (SiN$_x$), silicon oxynitride (SiO$_x$N$_y$), aluminum oxide (AlO$_x$), and titanium oxide (TiO$_x$). However, the disclosure is not necessarily limited to the above-described examples.

The transistor TR may be disposed on the buffer layer BFL. The transistor TR may be a thin film transistor. According to one or more embodiments, the transistor TR may be a driving transistor. The transistor TR may be electrically connected to the light emitting element LD.

The transistor TR may include an active layer ACT, the first transistor electrode TE1, a second transistor electrode TE2, and a gate electrode GE.

The active layer ACT may refer to a semiconductor layer. The active layer ACT may be disposed on the buffer layer BFL. The active layer ACT may include one of polysilicon, low temperature polycrystalline silicon (LTPS), amorphous silicon, and an oxide semiconductor.

The active layer ACT may include a first contact region in contact with the first transistor electrode TE1 and a second contact region in contact with the second transistor electrode TE2. The first contact region and the second contact region may be semiconductor patterns doped with impurities. A region between the first contact region and the second contact region may be a channel region. The channel region may be an intrinsic semiconductor pattern not doped with impurities.

The gate electrode GE may be disposed on the gate insulating layer GI. The position of the gate electrode GE may correspond to the position of the channel region of the active layer ACT. For example, the gate electrode GE may be disposed on the channel region of the active layer ACT with the gate insulating layer GI interposed therebetween.

The gate insulating layer GI may be disposed on the active layer ACT. The gate insulating layer GI may include an inorganic material. For example, the gate insulating layer GI may include one of silicon oxide (SiO$_x$), silicon nitride (SiN$_x$), silicon oxynitride (SiO$_x$N$_y$), aluminum oxide (AlO$_x$), and titanium oxide (TiO$_x$). However, the disclosure is not necessarily limited to the above-described examples.

The interlayer insulating layer ILD may be disposed on the buffer layer BFL. The interlayer insulating layer ILD may cover the gate electrode GE, the gate insulating layer GI, and the active layer ACT. According to one or more embodiments, the interlayer insulating layer ILD may include one of silicon oxide (SiO$_x$), silicon nitride (SiN$_x$), silicon oxynitride (SiO$_x$N$_y$), aluminum oxide (AlO$_x$), and titanium oxide (TiO$_x$). However, the disclosure is not necessarily limited to the above-described examples.

The interlayer insulating layer ILD may form a surface on which the bank BNK, the color conversion layer CCL, the first transistor electrode TE1, and the second transistor electrode TE2 are disposed. For example, the interlayer insulating layer ILD may be disposed below the first transistor electrode TE1 and the second transistor electrode TE2. The interlayer insulating layer ILD may be disposed below the first and second transistor electrodes TE1 and TE2 and disposed on the base layer BSL.

The interlayer insulating layer ILD may be a layer in which contact portions CNT are formed. The contact portions CNT may be formed in the interlayer insulating layer ILD. The contact portions CNT may include the lower contact portion BCNT, a first contact portion CNT1, and a second contact portion CNT2. For example, the lower contact portion BCNT may penetrate the buffer layer BFL and the interlayer insulating layer ILD. The first contact portion CNT1 may penetrate the interlayer insulating layer ILD. The second contact portion CNT2 may penetrate the interlayer insulating layer ILD.

The first transistor electrode TE1 and the second transistor electrode TE2 may be disposed on the interlayer insulating layer ILD. The first transistor electrode TE1 may be in contact with the first contact region of the active layer ACT through the first contact portion CNT1 penetrating the interlayer insulating layer ILD. The second transistor electrode TE2 may be in contact with the second contact region of the active layer ACT through the second contact portion CNT2 penetrating the interlayer insulating layer ILD. For example, the first transistor electrode TE1 may be a drain electrode, and the second transistor electrode TE2 may be a source electrode. However, the disclosure is not limited thereto.

The transistor TR may be electrically connected to the light emitting element LD. The first transistor electrode TE1 may be electrically connected to the light emitting element LD to supply an anode signal to the light emitting element LD. For example, the first transistor electrode TE1 may be electrically connected to the first bridge electrode BE1 and the anode electrode AE (for example, a first electrode), and the anode electrode AE may be electrically connected to the light emitting element LD.

The first transistor electrode TE1 and the second transistor electrode TE2 may be formed in a same process. The first transistor electrode TE1 and the second transistor electrode TE2 may be disposed on a same layer.

The first transistor electrode TE1 and the second transistor electrode TE2 may include a same material or a similar material. According to one or more embodiments, the first transistor electrode TE1 and the second transistor electrode TE2 may include a reflective material. For example, the first transistor electrode TE1 and the second transistor electrode TE2 may include at least one selected from the group consisting of silver (Ag), magnesium (Mg), aluminum (Al), platinum (Pt), palladium (Pd), gold (Au), nickel (Ni), neodymium (Nd), iridium (Ir), chromium (Cr), titanium (Ti), or an alloy thereof. However, the disclosure is not necessarily limited to the above-described examples.

According to one or more embodiments, the first transistor electrode TE1 and the second transistor electrode TE2 may be referred to as source or drain electrodes.

The first bridge electrode BE1 may be disposed on the first transistor electrode TE1. The first bridge electrode BE1 may electrically connect the first transistor electrode TE1 and the anode electrode AE. The second bridge electrode BE2 may be disposed on the second transistor electrode TE2. The second bridge electrode BE2 may be electrically connected to the second transistor electrode TE2. According to one or more embodiments, the formation of the first and second bridge electrodes BE1 and BE2 may be omitted.

The first additional electrode 1200 and the second additional electrode 1400 may be disposed on the interlayer insulating layer ILD. The first additional electrode 1200 and the second additional electrode 1400 may be paths through which electrical signals are transmitted. According to one or more embodiments, the first additional electrode 1200 may be disposed on a same layer as the first and second transistor electrodes TE1 and TE2, and the second additional electrode 1400 may be disposed on a same layer as the first and second bridge electrodes BE1 and BE2.

The bank BNK may be disposed on the interlayer insulating layer ILD. Banks BNK may be provided. The bank BNK may protrude in the thickness direction of the base layer BSL (for example, a direction opposite to the third direction DR3) and may have a shape surrounding at least a partial area (for example, the emission area EMA). Accordingly, the bank BNK may form an opening (or space) in which the color conversion layer CCL may be disposed.

The bank BNK may define the emission area EMA. For example, the emission area EMA may include an area that does not overlap the bank BNK in a plan view. The emission area EMA may refer to an area from which light may be emitted. According to one or more embodiments, in the emission area EMA, light may pass through at least one of the first to third color filters CF1, CF2, and CF3 and the base layer BSL, and may be emitted to the outside.

The non-emission area NEA may be an area outside the emission area EMA and may refer to an area from which light is not emitted. The non-emission area NEA may overlap the bank BNK in a plan view.

The bank BNK may include an organic material such as an acrylates resin, an epoxy resin, a phenolic resin, a polyamides resin, a polyimides resin, a polyesters resin, a polyphenylenesulfides resin, or benzocyclobutene (BCB). However, the disclosure is not necessarily limited thereto, and the bank BNK may include various kinds of inorganic materials such as silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

The bank BNK may separate the light emitting element LD and the layer on which the active layer ACT is disposed. For example, the bank BNK may be a via layer. Experimentally, an intermediate layer having a sufficient height may be required to separate the light emitting element LD and the layer on which the active layer ACT is disposed. For example, it may be necessary to perform a process for disposing an intermediate layer comprising an organic material so as to have a sufficient height. However, according to one or more embodiments, since the color conversion layer CCL is disposed under or below the light emitting element LD, and the bank BNK for forming a space in which the color conversion layer CCL is disposed has a shape protruding in one direction or a direction, process steps for forming the intermediate layer can be simplified (for example, the number of masks can be reduced). As the process steps are simplified, the process costs can be reduced.

One surface or a surface (for example, a side surface) of the bank BNK may face the color conversion layer CCL. The bank BNK may form a region (or surface) on which the reflective electrode layer REL is disposed.

The bank BNK and the first and second transistor electrodes TE1 and TE2 may be spaced apart from the base layer BSL by a substantially equal distance. For example, a lower surface of the bank BNK may be spaced apart from the base layer BSL by a first distance D1, and lower surfaces of the first and second transistor electrodes TE1 and TE2 may be spaced apart from the base layer BSL by a second distance D2. The first distance D1 and the second distance D2 may be a same (for example, may be substantially a same).

The reflective electrode layer REL may be disposed on the bank BNK. The reflective electrode layer REL may be one surface or a surface of the bank BNK, and the color conversion layer CCL may be disposed (or arranged) on an opposite surface. The reflective electrode layer REL may include a first reflective electrode REL1 and a second reflective electrode REL2. According to one or more embodiments, the first reflective electrode REL1 may be disposed on the bank BNK, and the second reflective electrode REL2 may be disposed on the first reflective electrode REL1.

The reflective electrode layer REL may include a reflective material. The reflective electrode layer REL may form a reflective wall on one surface or a surface of the bank BNK. Accordingly, the reflective electrode layer REL may improve light emitting efficiency of the light emitting element LD by recycling light emitted from the light emitting element LD. According to one or more embodiments, the reflective electrode layer REL (or the first reflective electrode REL1 and the second reflective electrode REL2) may include at least one selected from the group consisting of silver (Ag), magnesium (Mg), aluminum (Al), platinum (Pt), palladium (Pd), gold (Au), nickel (Ni), neodymium (Nd), iridium (Ir), chromium (Cr), titanium (Ti), or an alloy thereof. However, the disclosure is not necessarily limited to the above-described examples. The reflective electrode layer REL may include one or more of various materials suitable for reflecting light and having conductivity.

As described above, a surface on which the reflective electrode layer REL is formed may be formed by the bank BNK, and the bank BNK may define a space in which the color conversion layer CCL is provided. Accordingly, the reflective electrode layer REL may recycle light emitted from the color conversion layer CCL. For example, a wavelength conversion pattern WCP may form a light emitting body to provide light based on the light provided from the light emitting element LD, and the provided light may be recycled by the reflective electrode layer REL adjacent to the color conversion layer CCL.

The reflective electrode layer REL may be disposed on a same layer as at least some or a number of electrodes for forming the pixel circuit (or the pixel circuit layer PCL) for driving the light emitting element LD. For example, the reflective electrode layer REL may be disposed on a same layer as at least one of electrodes for forming the transistor TR. The first reflective electrode REL1 may be disposed on a same layer as the first and second transistor electrodes TE1 and TE2. The second reflective electrode REL2 may be disposed on a same layer as the first and second bridge electrodes BE1 and BE2. According to one or more embodiments, the first reflective electrode REL1 may be formed in a same process as the first contact portion CNT1 and may include a same material or a similar material. The second reflective electrode REL2 may be formed in a same process as the second contact portion CNT2 and may include a same material or a similar material.

Experimentally, when the bank BNK for forming the space in which the color conversion layer CCL is disposed is formed on a different layer from the electrodes for forming the pixel circuit (or the pixel circuit layer PCL), since a process for forming a reflective pattern disposed on the bank BNK may be additionally performed, an additional process step may be required. However, according to one or more embodiments, since the reflective electrode layer REL disposed on the bank BNK for forming the space in which the color conversion layer CCL is disposed may be disposed on a same layer as the electrodes for forming the pixel circuit, the process steps can be simplified, and consequently the process costs can be reduced.

According to one or more embodiments, the display device DD may be a bottom emission display, and the first and second transistor electrodes TE1 and TE2 may be formed in a same process as the reflective electrode layer REL. For example, when the display device DD is a top emission display, the color conversion layer CCL may have to be disposed outside the light emitting element LD (for example, on top of the thin film encapsulation layer TFE). The bank BNK for forming a region in which the color conversion layer CCL is disposed may be disposed after the first and second transistor electrodes TE1 and TE2 are formed. As a result, according to one or more embodiments, a structure suitable for patterning the first and second transistor electrodes TE1 and TE2 and the reflective electrode layer REL at a same time may be provided.

The pads PAD may be disposed in the pad area PDA. The pads PAD may include a first pad layer PAL1 and a second pad layer PAL2. According to one or more embodiments, the first pad layer PAL1 may be disposed on a same layer as the first and second transistor electrodes TE1 and TE2. The second pad layer PAL2 may be disposed on a same layer as the first and second bridge electrodes BE1 and BE2.

The color conversion layer CCL may be disposed in a space (or opening) formed by the bank BNK. The color conversion layer CCL may be disposed on the interlayer insulating layer ILD. The color conversion layer CCL may face one surface or a surface of the reflective electrode layer REL.

The color conversion layer CCL may be disposed between the light emitting element LD and the base layer BSL.

Accordingly, the light emitted from the light emitting element LD may pass through the color conversion layer CCL and may be provided to the base layer BSL.

The color conversion layer CCL may change the wavelength of the light provided from the light emitting element LD or transmit the light. The color conversion layer CCL may include the wavelength conversion pattern WCP.

For example, in the first sub-pixel PXL1 emitting light of the first color (for example, red), the wavelength conversion pattern WCP of the color conversion layer CCL may include first color conversion particles that convert light of the third color into light of the first color. The first color conversion particles may include first quantum dots that convert blue light into red light. The first quantum dots may absorb blue light and shift the wavelength according to energy transition to emit red light. For reference, FIG. 3 shows a structure including the first sub-pixel PXL1.

According to another example, in the second sub-pixel PXL2 emitting light of the second color (for example, green), the wavelength conversion pattern WCP of the color conversion layer CCL may include second color conversion particles that convert light of the third color into light of the second color. The second color conversion particles may include second quantum dots that convert blue light into green light. The second quantum dots may absorb blue light and shift the wavelength according to energy transition to emit green light.

The first quantum dots and the second quantum dots may have a shape of a sphere, a pyramid, a multi-arm, or a cubic nanoparticle, nanotube, nanowire, nanofiber, nanoplatelet particle, and the like within the spirit and the scope of the disclosure. However, the disclosure is not necessarily limited thereto, and shapes of the first quantum dots and the second quantum dots may be variously changed.

According to another example, in the third sub-pixel PXL3 emitting light of the third color (for example, blue), the color conversion layer CCL may include a light transmission pattern (not shown), and may not include the wavelength conversion pattern WCP. The light transmission pattern may be a member for efficiently using the light emitted from the light emitting element LD, and may include light scattering particles (for example, scatterers) dispersed in a given matrix material such as a base resin. For example, the light transmission pattern may include light scattering particles such as silica, but the material constituting the light scattering particles is not limited thereto.

The insulating layer INS may be disposed on the interlayer insulating layer ILD. The insulating layer INS may cover the reflective electrode layer REL, the color conversion layer CCL, the first and second transistor electrodes TE1 and TE2, the first and second bridge electrodes BE1 and BE2, the first and second additional electrodes 1200 and 1400, and the first and second pad layers PAL1 and PAL2. The insulating layer INS may form an opening for electrically connecting the anode electrode AE and the first transistor electrode TE1.

The insulating layer INS may seal (or cover) the color conversion layer CCL. The insulating layer INS may protect the electrodes and the color conversion layer CCL from external influences.

According to one or more embodiments, the insulating layer INS may simultaneously protect (or cover) the color conversion layer CCL and the first and second transistor electrodes TE1 and TE2. For example, according to one or more embodiments, a configuration for protecting the color conversion layer CCL and the first and second transistor electrodes TE1 and TE2 may be unified by the insulating layer INS. The process steps can be simplified by reducing the number of separately required components.

The insulating layer INS may include one insulating material of silicon oxide ($SiO_x$), silicon nitride ($SiN_x$), silicon oxynitride ($SiO_xN_y$), aluminum oxide ($AlO_x$), and titanium oxide ($TiO_x$). The insulating layer INS may have a single-layer or multi-layer structure. However, the disclosure is not necessarily limited to the above-described examples.

The light emitting element LD may be disposed on the insulating layer INS. The light emitting element LD may be disposed on the color conversion layer CCL. The light emitting element LD may overlap the emission area EMA in a plan view. The light emitting element LD may overlap the color conversion layer CCL in a plan view. The light emitting element LD may be disposed between the anode electrode AE and the cathode electrode CE. The light emitting element LD may be disposed to substantially correspond to a region defined by the pixel defining layer PDL.

The light emitting element LD may emit light. The light emitting element LD may be disposed in the display area DA. According to one or more embodiments, the light emitting element LD may be an organic light emitting diode (OLED). According to one or more embodiments, the light emitting element LD may be composed of various diodes in addition to the organic light emitting diode. For convenience of description, one or more embodiments in which the light emitting element LD is composed of an organic light emitting diode will be described as an example.

A structure of the light emitting element LD will be described with reference to FIG. 4. Referring to FIG. 4, the light emitting element LD may include a light generation layer LGL. The light emitting element LD may include a hole injection layer HIL, a hole transport layer HTL, the light generation layer LGL, a hole blocking layer HBL, an electron transport layer ETL, and an electron injection layer EIL.

According to one or more embodiments, the hole injection layer HIL may be a layer for injecting holes. The hole transport layer HTL may have excellent hole transport properties and may be a layer for increasing the chance of recombination of holes and electrons by suppressing movement of electrons that have not been combined in the light generation layer LGL. The light generation layer LGL may be a layer that emits light by recombination of injected electrons and holes. The hole blocking layer HBL may be a layer for suppressing movement of holes that are not coupled in the light generation layer LGL. The electron transport layer ETL may be a layer for smoothly transporting electrons to the light generation layer LGL. The electron injection layer EIL may be a layer for injecting electrons.

The light emitting element LD may be formed (or provided) after the color filter layer CF and the color conversion layer CCL are formed. According to one or more embodiments, a high-temperature process environment may be required to manufacture the color conversion layer CCL and the color filter layer CF. Experimentally, when the color filter layer CF and the color conversion layer CCL are formed after the light emitting element LD is formed, the light emitting element LD may be damaged due to the high-temperature process environment. However, according to one or more embodiments, since the light emitting element LD is formed after the color filter layer CF and the color conversion layer CCL are formed, a risk of damage to the light emitting element LD can be substantially reduced, and operation reliability of the light emitting element LD can be improved.

Subsequently, referring to FIG. 3, the light emitting element LD may emit light based on electrical signals provided from the anode electrode AE and the cathode electrode CE. For example, the light emitting element LD may receive an anode signal from the anode electrode AE and may receive a cathode signal (or a ground signal) from the cathode electrode CE.

The cathode electrode CE may be disposed on one surface or a surface of the light emitting element LD. The cathode electrode CE may provide the cathode signal to the light emitting element LD. The anode electrode AE may be disposed on one surface or a surface of the light emitting element LD. The anode electrode AE may provide the anode signal to the light emitting element LD. According to one or more embodiments, the anode electrode AE may be disposed between the color conversion layer CCL and the light emitting element LD. However, the disclosure is not limited to the above-described examples. According to one or more embodiments, the cathode electrode CE may be disposed between the color conversion layer CCL and the light emitting element LD.

The anode electrode AE may be disposed on the insulating layer INS, and a portion of the anode electrode AE may be electrically connected to the first transistor electrode TE1. For example, a portion of the anode electrode AE may be electrically connected to the first transistor electrode TE1 through the first bridge electrode BE1.

The pixel defining layer PDL may define a position where the light emitting element LD implemented as an organic light emitting diode is arranged. The pixel defining layer PDL may include an organic material. According to an example, the pixel defining layer PDL may include at least one of an acryl resin, an epoxy resin, a phenolic resin, a polyamide resin, and a polyimide resin. However, the disclosure is not necessarily limited to the above-described examples.

The thin film encapsulation layer TFE may be disposed on the anode electrode AE, the cathode electrode CE, the pixel defining layer PDL, and the insulating layer INS. The thin film encapsulation layer TFE may reduce a step difference caused by the light emitting element LD and the pixel defining layer PDL. The thin film encapsulation layer TFE may include insulating layers covering the light emitting element LD. According to an example, the thin film encapsulation layer TFE may have a structure in which an inorganic insulating layer and an organic insulating layer may be alternately stacked each other.

Cross-sectional structures of the display device DD according to the embodiments are not necessarily limited to the above-described examples. According to one or more embodiments, the cross-sectional structure of the display device DD may be variously changed and may further include additional components. For example, the display device DD may further include an anti-reflection film.

The display device DD according to an embodiment will be described with reference to FIG. 5. Contents that may overlap the above-described contents will be briefly described or will not be repeatedly described.

Referring to FIG. 5, the display device DD according to an embodiment may be different from the display device DD according to the embodiment (refer to FIG. 3) in that the color filter layer CF is disposed adjacent to the color conversion layer CCL.

The color filter layer CF may be formed (or patterned) after the active layer ACT, the gate electrode GE, and the interlayer insulating layer ILD are formed. For example, the color filter layer CF may be disposed between the color conversion layer CCL and the interlayer insulating layer ILD (or the buffer layer BFL). The color filter layer CF may be disposed between the color conversion layer CCL and the active layer ACT. Accordingly, the color filter layer CF may be further adjacent to the color conversion layer CCL.

The contact portions CNT may penetrate the color filter layer CF. For example, the lower contact portion BCNT may penetrate the first to third color filters CF1, CF2, and CF3. According to one or more embodiments, when the color filter layer CF is patterned, holes for forming the lower contact portion BCNT, the first contact portion CNT1, and the second contact portion CNT2 may be formed in the first to third color filters CF1, CF2, and CF3. Thereafter, as the first transistor electrode TE1 and the second transistor electrode TE2 are patterned, the lower contact portion BCNT, the first contact portion CNT1, and the second contact portion CNT2 penetrating the color filter layer CF may be provided.

Hereinafter, a method of manufacturing the display device DD according to embodiments will be described with reference to FIGS. 6 to 12. Contents that may overlap the above-described contents will be briefly described or will not be repeatedly described.

FIGS. 6 to 12 are schematic cross-sectional views schematically illustrating a method of manufacturing a display device according to embodiments in each process step. For convenience of description, FIGS. 6 to 12 are schematic cross-sectional views schematically illustrating the display device DD according to the embodiment described with reference to FIG. 3. For example, FIGS. 6 to 12 may be schematic cross-sectional views taken along line A-A' of FIG. 1.

Figure 6:
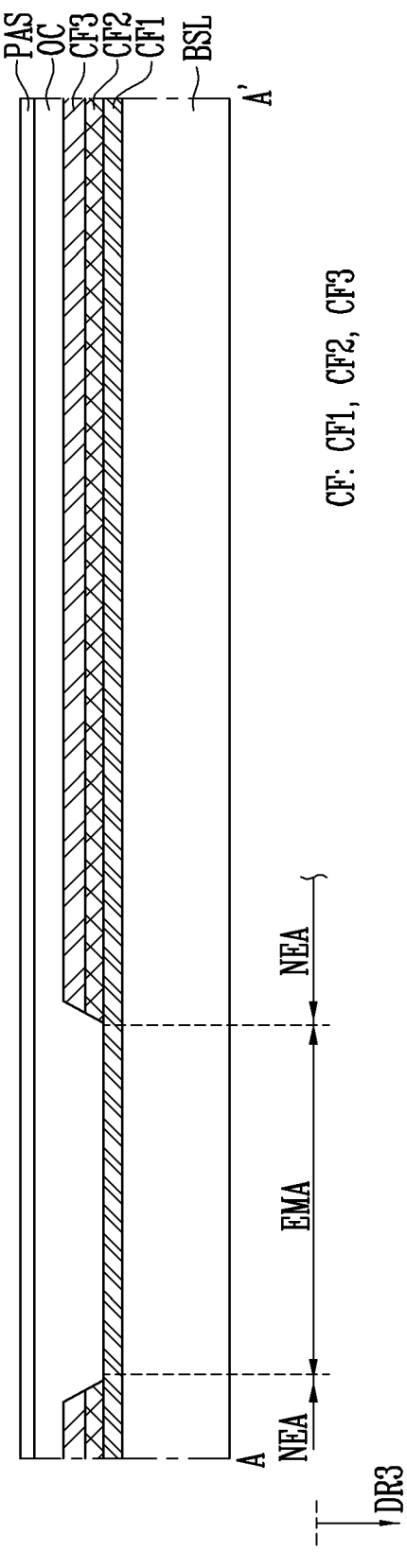

Referring to FIG. 6, the color filter layer CF, the planarization layer OC, and the passivation layer PAS may be disposed (or formed) on the base layer BSL.

The color filter layer CF may be patterned on the base layer BSL by disposing a material for forming the color filter layer CF and performing a photoresist process using a mask (not shown). According to one or more embodiments, the material for forming the color filter layer CF may be disposed on the base layer BSL by a spin coating method, a slit coating method, or the like within the spirit and the scope of the disclosure. However, the disclosure is not limited to the above-described examples, and various methods may be used for disposing the material for forming the color filter layer CF.

The first color filter CF1, the second color filter CF2, and the third color filter CF3 may be sequentially patterned. Some or a number of the first color filter CF1, the second color filter CF2, and the third color filter CF3 may be opened according to the type of sub-pixel to be formed. For example, in FIG. 6, in order to manufacture the first sub-pixel PXL1 for providing light of the first color, the second color filter CF2 and the third color filter CF3 may not be disposed at positions for forming the emission area EMA.

In this step, the planarization layer OC may be disposed on the color filter layer CF to reduce a step difference caused by the color filter layer CF and may protect the color filter layer CF. In addition, the passivation layer PAS may be disposed on the planarization layer OC to protect the color filter layer CF.

Figure 7:
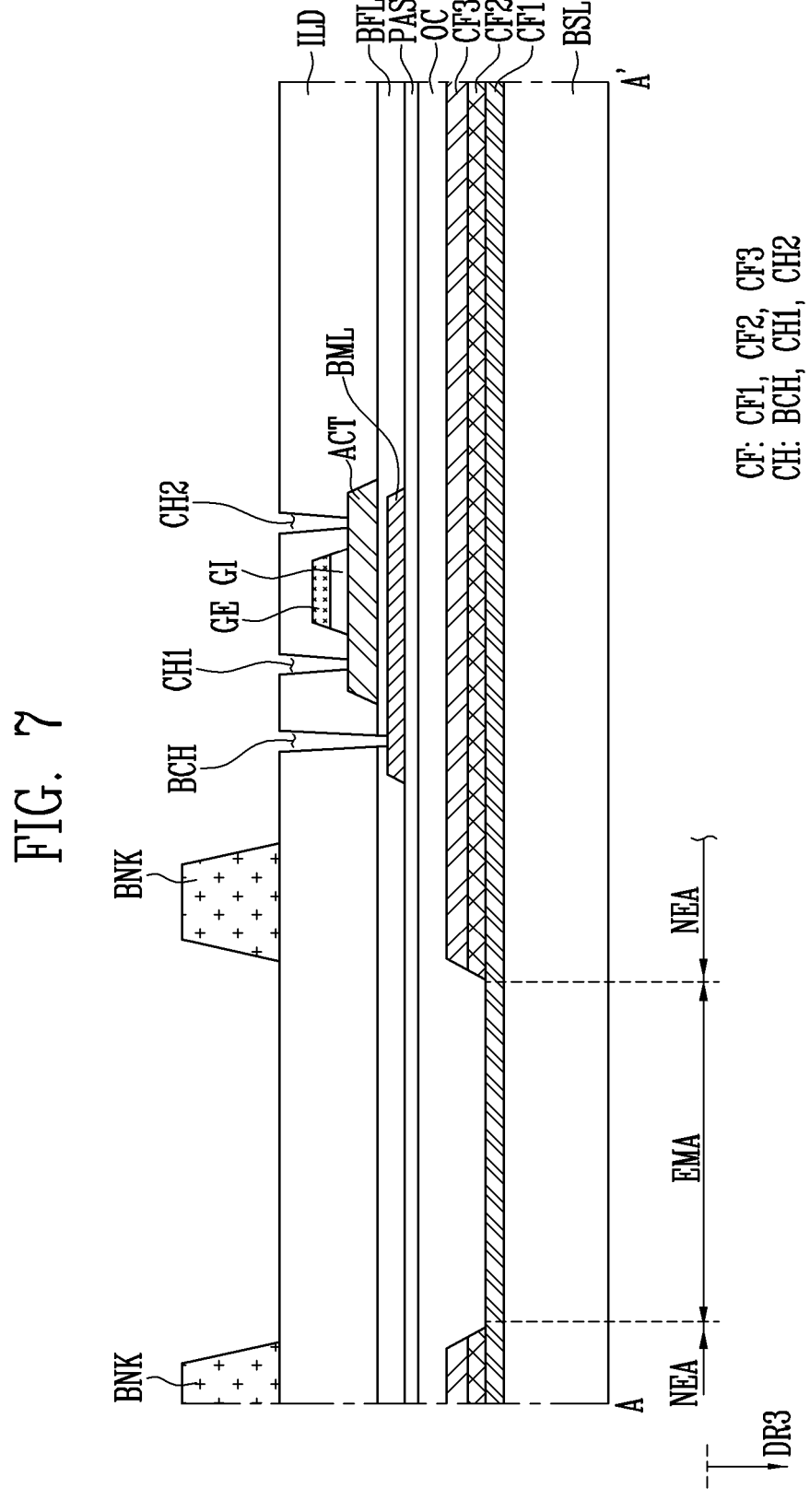

Referring to FIG. 7, the lower auxiliary electrode BML, the buffer layer BFL, the active layer ACT, the gate insulating layer GI, the gate electrode GE, and the interlayer insulating layer ILD may be disposed (or formed) in on the passivation layer PAS (or the base layer BSL). After the interlayer insulating layer ILD is formed, the bank BNK may be disposed (or formed) on the interlayer insulating layer ILD.

The lower auxiliary electrode BML, the buffer layer BFL, the active layer ACT, the gate insulating layer GI, the gate electrode GE, and the interlayer insulating layer ILD may be provided (or patterned) by a photoresist process using a mask. For example, after the active layer ACT is patterned, the gate insulating layer GI may be patterned on the active layer ACT, and the gate electrode GE may be patterned on the gate insulating layer GI.

According to one or more embodiments, at least a portion of each of the lower auxiliary electrode BML and the active layer ACT may be exposed by forming contact holes CH. For example, a lower contact hole BCH penetrating the interlayer insulating layer ILD and the buffer layer BFL may be formed. A first contact hole CH1 and a second contact hole CH2 penetrating the interlayer insulating layer ILD may be formed. The lower contact hole BCH may refer to a hole region for forming the lower contact portion BCNT as a subsequent process is performed. The first and second contact holes CH1 and CH2 may refer to hole regions for forming the first and second contact portions CNT1 and CNT2 as a subsequent process is performed.

The bank BNK may be provided on the interlayer insulating layer ILD. The bank BNK may also be patterned by a photoresist process. For example, the bank BNK may be disposed to overlap the non-emission area NEA in a plan view. According to one or more embodiments, the bank BNK may be disposed to surround the emission EMA in a plan view.

Figure 8:
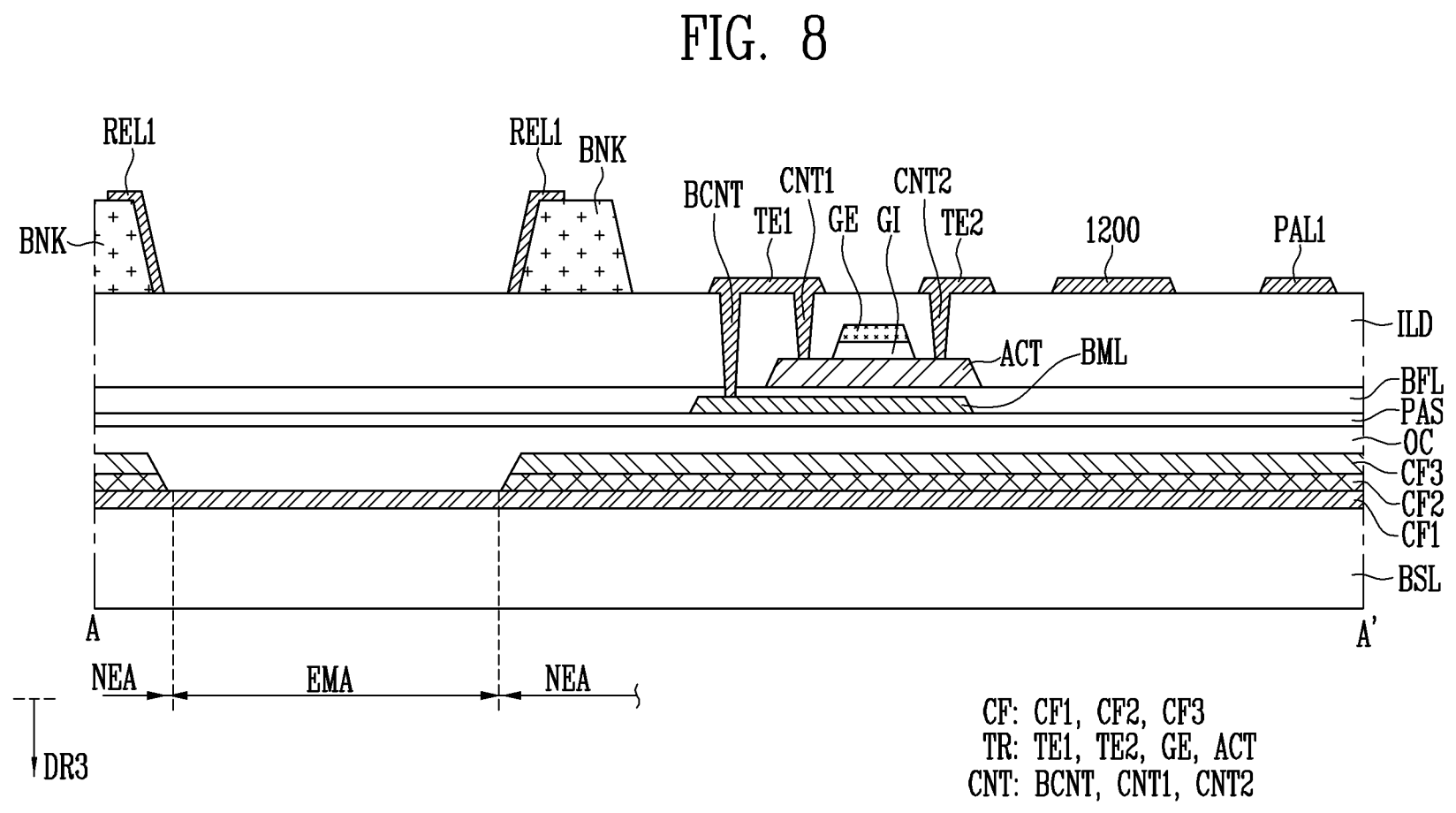

Referring to FIG. 8, the first reflective electrode REL1, the first and second transistor electrodes TE1 and TE2, the first additional electrode 1200, and the first pad layer PAL1 may be disposed (or formed).

The first reflective electrode REL1, the first and second transistor electrodes TE1 and TE2, the first additional electrode 1200, and the first pad layer PAL1 may be provided by depositing (or forming) a first base reflective electrode (not shown) and patterning the first base reflective electrode using a photoresist process.

When the first base reflective electrode is deposited, at least a portion of the first base reflective electrode may fill the contact holes CH. Accordingly, the lower contact portion BCNT corresponding to the lower contact hole BCH, the first contact portion CNT1 corresponding to the first contact hole CH1, and the second contact portion CNT2 corresponding to the second contact hole CH2 may be formed.

For example, the first reflective electrode REL1 and the first and second transistor electrodes TE1 and TE2 may be patterned in a same process. According to one or more embodiments, the first reflective electrode REL1 and the first and second transistor electrodes TE1 and TE2 may be formed at a same time and may include a same material or a similar material.

The first reflective electrode REL1 may be disposed on one surface or a surface of the bank BNK to face the emission area EMA. Accordingly, the first reflective electrode REL1 may be a reflective wall formed on a side surface of the bank BNK.

As described above, the bank BNK may be a component for forming a space (or region) in which the color conversion layer CCL is disposed, and the first reflective electrode REL1 disposed on the bank BNK may be formed in a same process as an electrode for forming the transistor TR. Accordingly, the number of required masks can be reduced by integrating the process steps performed separately, and the process costs can be substantially reduced.

Figure 9:
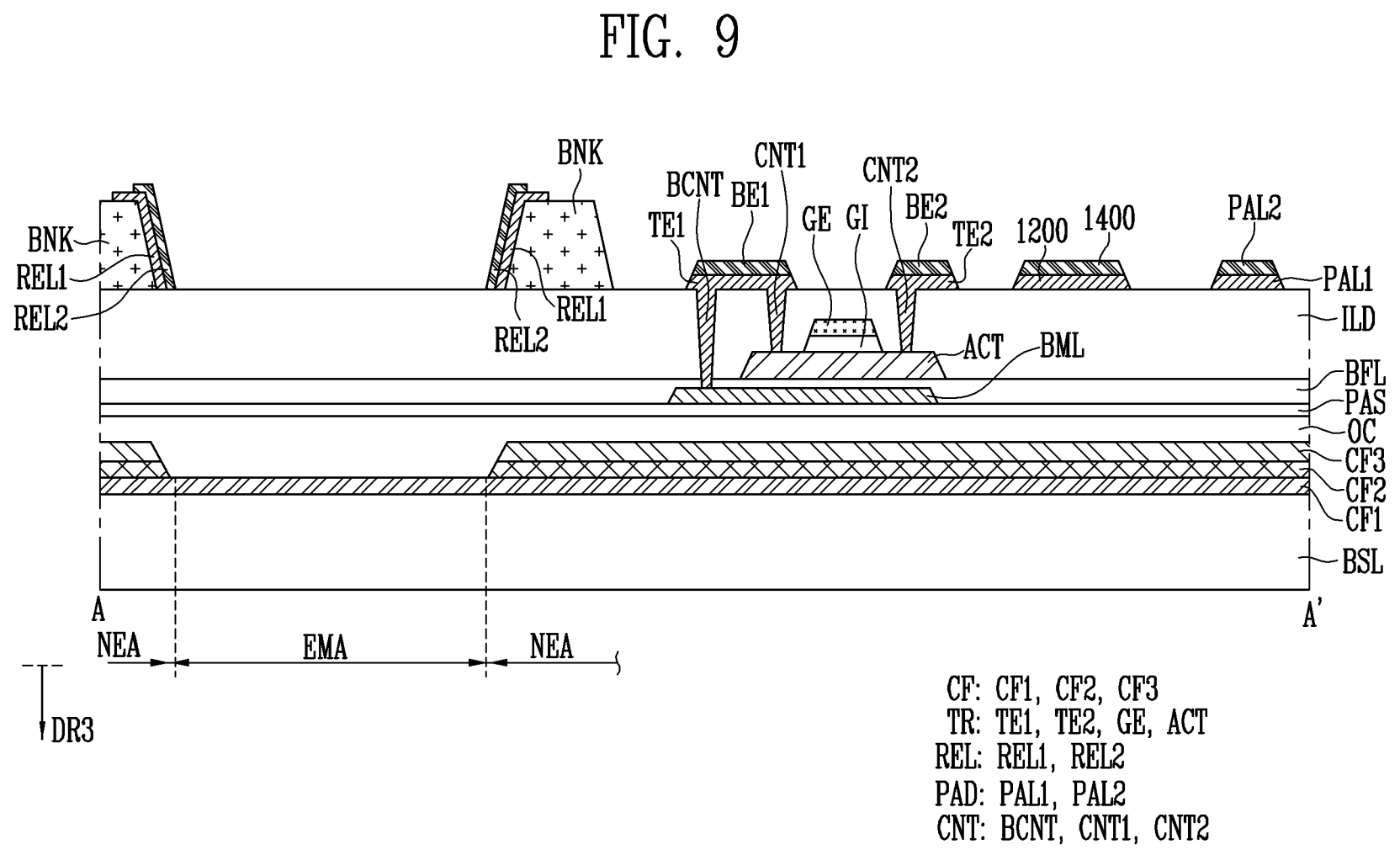

Referring to FIG. 9, the second reflective electrode REL2, the first and second bridge electrodes BR1 and BE2, the second additional electrode 1400, and the second pad layer PAL2 may be disposed (or formed).

The second reflective electrode REL2, the first and second bridge electrodes BE1 and BE2, the second additional electrode 1400, and the second pad layer PAL2 may be provided by depositing (or forming) a second base reflective electrode (not shown) and patterning the second base reflective electrode using a photoresist process.

The second reflective electrode REL2 may be disposed on the first reflective electrode REL1. The second reflective electrode REL2 may be disposed on one surface or a surface of the first reflective electrode REL1 to face the emission area EMA.

According to one or more embodiments, similar to the first reflective electrode REL1, since the second reflective electrode REL2 is patterned in a same process as other wirings (for example, the first and second bridge electrodes BE1 and BE2, the second additional electrode 1400, and/or the second pad layer PAL2), the number of masks can be substantially reduced.

Figure 10:
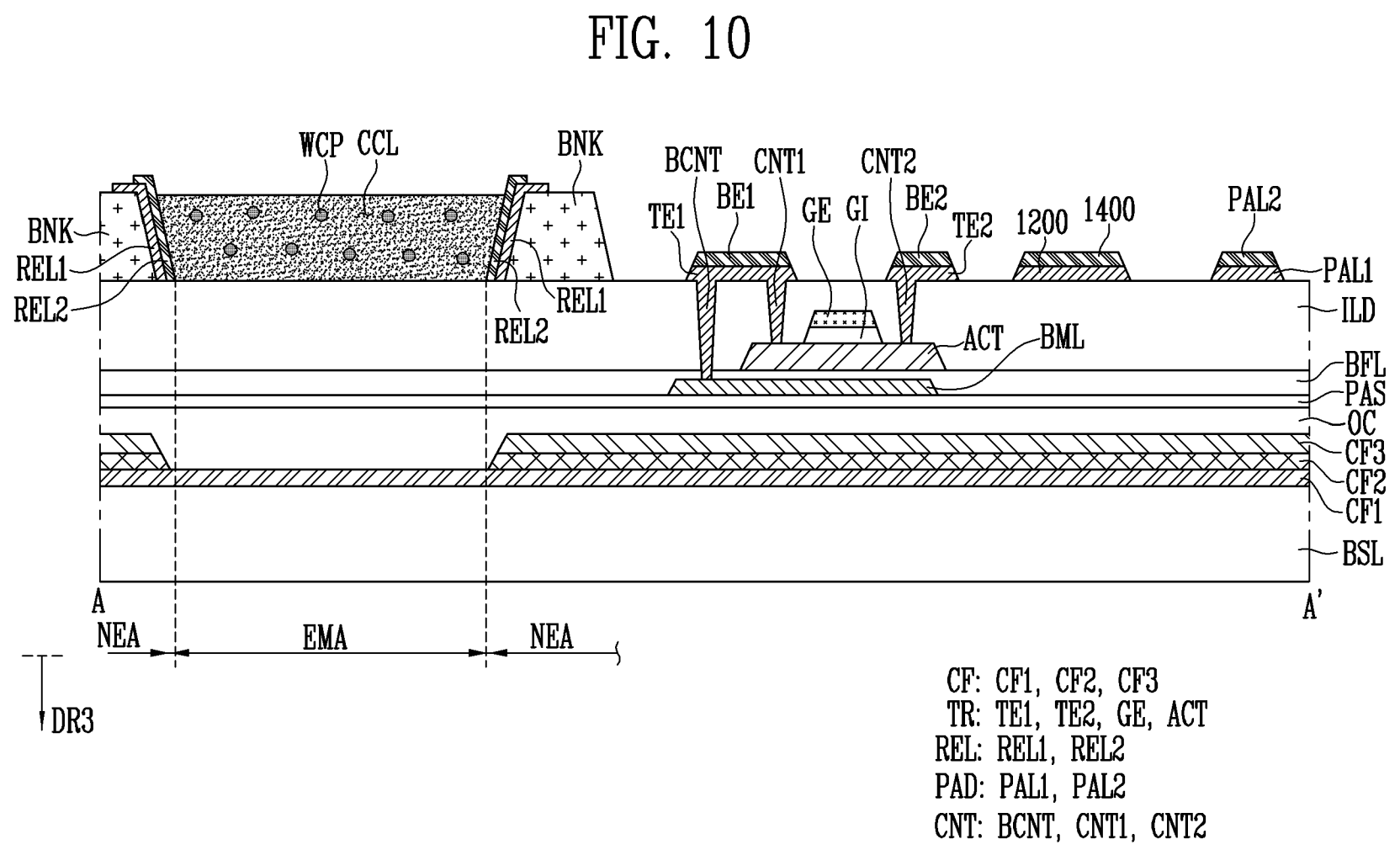

Referring to FIG. 10, the color conversion layer CCL may be disposed (or formed) in a space (or region) defined by the bank BNK.

The color conversion layer CCL may be formed to overlap the emission area EMA in a plan view. For example, the color conversion layer CCL may be filled in the space defined by the bank BNK having a shape protruding in one direction or a direction. For example, the bank BNK for forming the reflective electrode layer REL may form the space for the color conversion layer CCL to be patterned at a same time.

The color conversion layer CCL may be a component including the wavelength conversion pattern WCP (for example, first quantum dots or second quantum dots) or the light transmission pattern, and may be patterned in an area corresponding to the emission area EMA in a plan view. According to one or more embodiments, the color conversion layer CCL may be formed by various methods. For example, the color conversion layer CCL may be formed by an inkjet printing method. However, the disclosure is not necessarily limited to the above-described examples.

According to one or more embodiments, the color conversion layer CCL may face the reflective electrode layer REL. Accordingly, at least a portion of the light emitted through the color conversion layer CCL may be reflected by the reflective electrode layer REL. Accordingly, light output efficiency of the display device DD can be improved. According to one or more embodiments, at least a portion of the color conversion layer CCL may be in contact with the reflective electrode layer REL (for example, the second reflective electrode REL2). For example, according to one or more embodiments, the color conversion layer CCL and the reflective electrode layer REL may be spaced apart from the base layer BSL by substantially a same distance.

Figure 11:
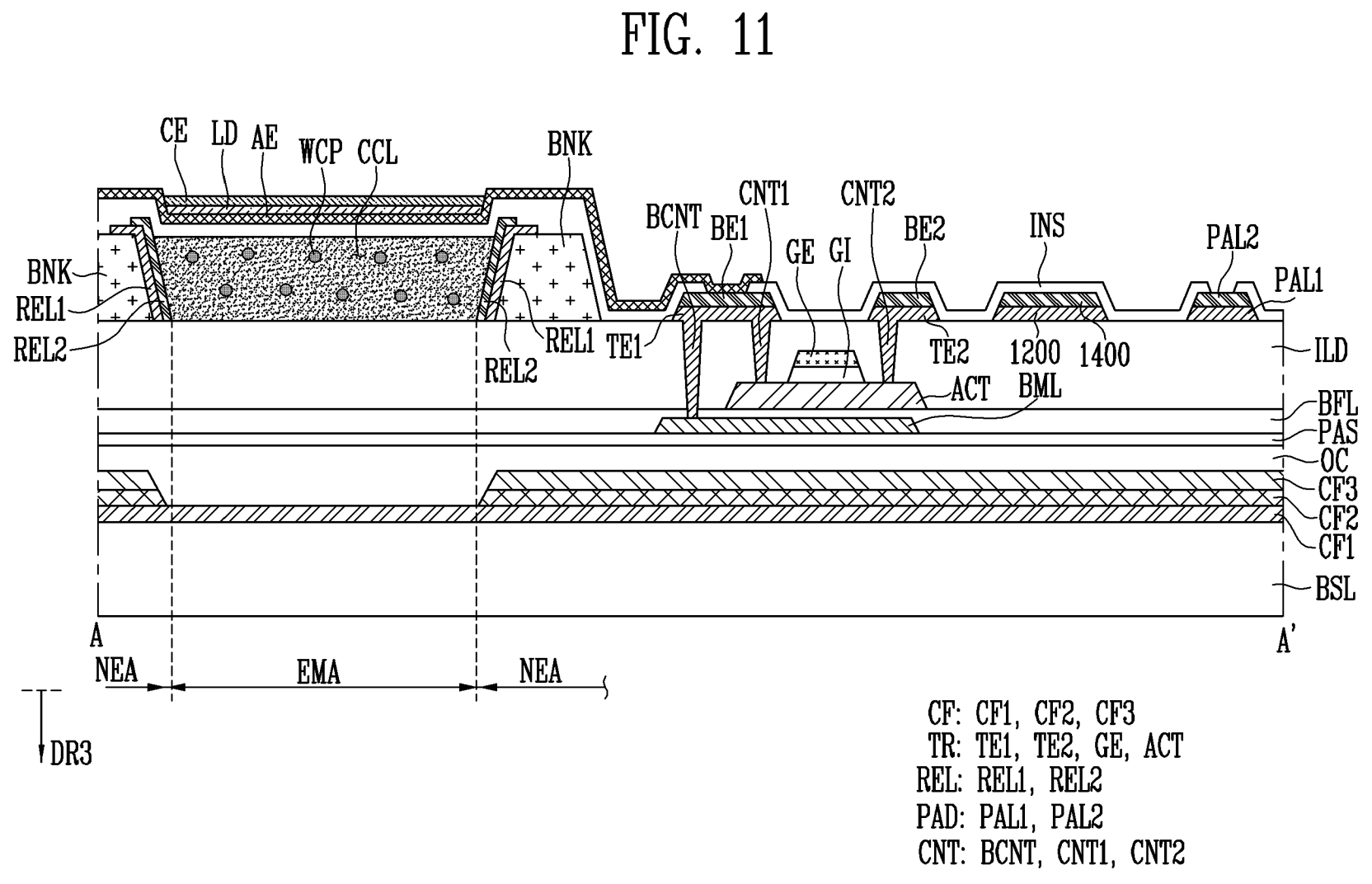

Referring to FIG. 11, the insulating layer INS, the anode electrode AE, the light emitting element LD, and the cathode electrode CE may be disposed (or formed). In this step, the light emitting element LD may emit light by being electrically connected to the anode electrode AE and the cathode electrode CE.

The insulating layer INS may be formed by depositing a given material (for example, an inorganic material) and patterning the deposited material using a photoresist process. The insulating layer INS may be patterned to cover the color conversion layer CCL. In addition, the insulating layer INS may be patterned to cover the reflective electrode layer REL, the bank BNK, the first and second transistor electrodes TE1 and TE2, the first and second additional electrodes 1200 and 1400, and the pads PAD. According to one or more embodiments, the insulating layer INS may expose the first bridge electrode BE1. Accordingly, the anode electrode AE may be electrically connected to the first transistor electrode TE1 through the first bridge electrode BE1. According to one or more embodiments, when the first bridge electrode BE1 is not disposed, the insulating layer INS may expose the first transistor electrode TE1 so that the anode electrode AE may be electrically connected to the first transistor electrode TE1.

One surface or a surface of the light emitting element LD may be patterned to face the anode electrode AE, and the other surface of the light emitting element LD may be patterned to face the cathode electrode CE. According to one or more embodiments, the anode electrode AE may be disposed on the insulating layer INS, the light emitting element LD may be disposed on the anode electrode AE, and the cathode electrode CE may be disposed on the light emitting element LD. FIG. 11 shows one or more embodiments in which the anode electrode AE, the light emitting element LD, and the cathode electrode CE are arranged in order, but the disclosure is not limited thereto. According to one or more embodiments, the cathode electrode CE, the light emitting element LD, and the anode electrode AE may be arranged in order.

The light emitting element LD may be formed (or manufactured) by sequentially depositing layers for forming the light emitting element LD. A deposition process of stacking organic material layers (for example, layers including an evaporation source) may be performed to form the light emitting element LD. For example, a deposition process for forming the hole injection layer HIL, the hole transport layer HTL, the light generation layer LGL, the hole blocking layer HBL, the electron transport layer ETL, and the electron injection layer EIL may be performed. According to one or more embodiments, masks may be used to perform the deposition process. However, the disclosure is not necessarily limited to specific process examples.

Referring to FIG. 12, the pixel defining layer PDL may be disposed on the anode electrode AE, and the thin film encapsulation layer TFE may be disposed on the pixel defining layer PDL. Accordingly, the display device DD according to the embodiment may be provided. According to one or more embodiments, additional components may be disposed on the thin film encapsulation layer TFE and the pads PAD.

According to one or more embodiments, at least a portion of the pixel defining layer PDL may not overlap the emission area EMA in a plan view. The thin film encapsulation layer TFE may not overlap the pads PAD.

As a result, according to embodiments, by providing a reflective structure that simplifies process steps, the light output efficiency of the display device DD can be improved and the process costs can be reduced.

According to embodiments, a display device and a method of manufacturing a same in which the process costs can be reduced by simplifying the process steps can be provided.

As described above, the embodiments of the disclosure have been disclosed through the detailed description and the drawings. However, those skilled in the art or those of ordinary skill in the art will appreciate that various modifications and changes are possible without departing from the features and technical scope of the disclosure as set forth in the claims below.

Therefore, the scope of the disclosure is not limited to the detailed description described in the specification, and may be determined by the appended claims.

What is claimed is:

1. A display device comprising:
a transistor disposed on a base layer, the transistor comprising:
an active layer;
a gate electrode;
a first transistor electrode electrically connected to a first contact region of the active layer; and
a second transistor electrode electrically connected to a second contact region of the active layer;
an interlayer insulating layer disposed on the gate electrode;
a bank disposed on the interlayer insulating layer and protruding in a thickness direction of the base layer;
a color conversion layer disposed between a first portion of the bank and a second portion of the bank so as to overlap the first and second portions of the bank in a direction perpendicular to the thickness direction of the base layer, the color conversion layer including quantum dots that change a color of light; and
a light emitting element disposed on the color conversion layer,
wherein a reflective electrode layer is disposed on the first and second portions of the bank so as to surround the color conversion layer in the direction perpendicular to the thickness direction of the base layer.

2. The display device of claim 1, wherein
at least a portion of the reflective electrode layer, the first transistor electrode, and the second transistor electrode are disposed on a same layer, and
the at least the portion of the reflective electrode layer, the first transistor electrode, and the second transistor electrode include a same material.

3. The display device of claim 2, wherein
the reflective electrode layer includes:
a first reflective electrode disposed on the bank; and
a second reflective electrode disposed on the first reflective electrode, and
the first reflective electrode, the first transistor electrode, and the second transistor electrode are disposed on a same layer.

4. The display device of claim 3, further comprising:
a first bridge electrode disposed on the first transistor electrode;
a second bridge electrode disposed on the second transistor electrode; and
pads disposed on the interlayer insulating layer and including a first pad layer and a second pad layer disposed on the first pad layer, wherein
the first reflective electrode and the first pad layer are disposed on a same layer, and
the second reflective electrode, the first bridge electrode, the second bridge electrode, and the second pad layer are disposed on a same layer.

5. The display device of claim 1, wherein the bank separates the light emitting element and the active layer.

6. The display device of claim 1, further comprising:
an insulating layer, at least a portion of which is disposed on the color conversion layer,
wherein the insulating layer covers the color conversion layer, the first transistor electrode, and the second transistor electrode.

7. The display device of claim 1, wherein
the interlayer insulating layer forms a surface on which the bank, the first transistor electrode, and the second transistor electrode are disposed, and
the interlayer insulating layer is disposed below the first transistor electrode and the second transistor electrode and disposed on the base layer.

8. The display device of claim 1, wherein
the first transistor electrode is electrically connected to the first contact region through a first contact portion,
the second transistor electrode is electrically connected to the second contact region through a second contact portion,
each of the first contact portion and the second contact portion penetrates at least a portion of the interlayer insulating layer, and
at least a portion of the reflective electrode layer, the first contact portion, and the second contact portion include a same material.

9. The display device of claim 1, wherein
the bank protrudes in a direction to define a space including the color conversion layer,
the bank is spaced apart from the base layer by a first distance,
the first transistor electrode and the second transistor electrode are spaced apart from the base layer by a second distance, and
the first distance and the second distance are substantially equal to each other.

10. The display device of claim 1, wherein
the color conversion layer is disposed between the light emitting element and the base layer, and
light provided by the light emitting element is provided to outside of the display device through the color conversion layer and the base layer.

11. The display device of claim 1, further comprising:
a color filter layer disposed on the base layer, and
the color filter layer is disposed between the active layer and the base layer.

12. The display device of claim 1, further comprising:
a color filter layer disposed on the base layer, and
the active layer is disposed between the color filter layer and the base layer.

13. A method of manufacturing the display device of claim 1, comprising:
disposing the active layer, the gate insulating layer, the gate electrode, and the interlayer insulating layer on the base layer;
disposing the bank on the interlayer insulating layer;
disposing the reflective electrode layer on the first and second portions of the bank;
forming the first transistor electrode and the second transistor electrode on the interlayer insulating layer;
disposing the color conversion layer including the quantum dots that change the color of light between the first and second portions of the bank; and
disposing the light emitting element on the color conversion layer.

14. The method of claim 13, wherein
the reflective electrode layer includes a first reflective electrode disposed on the bank, and

23 the first reflective electrode, the first transistor electrode, and the second transistor electrode are formed in a same process.

15. The method of claim 14, further comprising:
disposing a first bridge electrode on the first transistor electrode; and
disposing a second bridge electrode on the second transistor electrode, wherein
the reflective electrode layer includes a second reflective electrode disposed on the first reflective electrode, and
the second reflective electrode, the first bridge electrode, and the second bridge electrode are formed in a same process.

16. The method of claim 13, further comprising:
forming an insulating layer to cover the color conversion layer, the first transistor electrode, and the second transistor electrode.

17. The method of claim 13, wherein
the disposing of the light emitting element includes performing a deposition process to form layers for forming the light emitting element, and
the performing of the deposition process is performed after the disposing of the color conversion layer.

18. The method of claim 13, wherein the light emitting element is an organic light emitting diode.

19. The method of claim 13, further comprising:
disposing a color filter layer on the base layer,
wherein the color filter layer and the color conversion layer are disposed between the base layer and the light emitting element.

20. The method of claim 14, further comprising:
forming a first contact hole and a second contact hole in the interlayer insulating layer; and;
forming a first contact portion corresponding to the first contact hole and a second contact portion corresponding to the second contact hole, wherein
the first transistor electrode is electrically connected to the first contact region through the first contact portion,
the second transistor electrode is electrically connected to the second contact region through the second contact portion, and
the first contact portion, the second contact portion, and the first reflective electrode are formed in a same process.

21. The display device of claim 1, wherein the reflective electrode layer is angled with respect to the thickness direction to face towards the light emitting element.

* * * * *